(12) United States Patent
Binnard et al.

(10) Patent No.: US 6,639,654 B2
(45) Date of Patent: Oct. 28, 2003

(54) WAFER STAGE CARRIER AND REMOVAL ASSEMBLY

(75) Inventors: Michael Binnard, Belmont, CA (US); Douglas C. Watson, Campbell, CA (US)

(73) Assignee: Nikon Corporation, Tokyo (JP)

( * ) Notice: Subject to any disclaimer, the term of this patent is extended or adjusted under 35 U.S.C. 154(b) by 40 days.

(21) Appl. No.: 09/843,077

(22) Filed: Apr. 27, 2001

(65) Prior Publication Data

US 2002/0159045 A1 Oct. 31, 2002

(51) Int. Cl.[7] .......................... G03B 27/58; G03B 27/42
(52) U.S. Cl. ................ 355/72; 355/53; 414/495; 414/935; 269/17
(58) Field of Search .................. 355/53, 72; 414/495, 414/498, 935; 254/10 R, 93 HP; 269/8, 17; 451/364

(56) References Cited

U.S. PATENT DOCUMENTS

| | | | | |
|---|---|---|---|---|
| 4,323,141 A | * | 4/1982 | Ragan et al. | 187/204 |
| 4,461,455 A | * | 7/1984 | Mills et al. | 180/125 |
| 5,123,803 A | * | 6/1992 | Crabtree | 269/17 |
| 6,296,239 B1 | * | 10/2001 | Sawyer | 269/17 |
| 6,390,762 B1 | * | 5/2002 | Peery et al. | 414/352 |
| 6,394,743 B1 | * | 5/2002 | Marsden et al. | 280/79.3 |

FOREIGN PATENT DOCUMENTS

| | | | |
|---|---|---|---|
| JP | 5-190644 | * | 7/1993 |
| JP | 5-335403 | * | 12/1993 |
| JP | 6-140493 | * | 5/1994 |
| JP | 7-291131 | | 11/1995 |

* cited by examiner

Primary Examiner—Alan A. Mathews
(74) Attorney, Agent, or Firm—Finnegan, Henderson, Farabow, Garrett & Dunner, L.L.P.

(57) ABSTRACT

A device and method are provided to remove a wafer stage carrier carrying a wafer stage assembly from an exposure apparatus. The wafer stage carrier may be removably fastened to the apparatus frame of the exposure apparatus by any types of mechanical fasteners. The removal assembly includes a set of expandable supports and a set of removal supports. When the apparatus frame supports the wafer stage carrier, the wafer stage carrier hangs above a stationary surface, such as the ground. To remove the wafer stage carrier, the set of expandable supports is expanded until it reaches the ground and is capable of supporting the weight of the wafer stage carrier. At this juncture, the mechanical fasteners may be removed to allow the weight of the wafer stage carrier to transfer from the apparatus frame to the expandable supports. The set of expandable supports may reduce its expansion to lower the wafer stage carrier away from the exposure apparatus until the set of removal supports reaches the ground and supports the weight of the wafer stage carrier.

58 Claims, 9 Drawing Sheets

WAFER STAGE CARRIER AND REMOVAL ASSEMBLY

BACKGROUND OF THE INVENTION

1. Field of the Invention

This invention relates to a carrier for sensitive devices and method for removing the sensitive devices constructed in a sub-assembly from a main assembly. In particular, this invention relates to a carrier and a removal assembly, such as a wafer stage carrier and removal assembly, to remove the wafer stage carried by the wafer stage carrier from an exposure apparatus. The exposure apparatus may be the type used in a photolithography process to manufacture semiconductor substrates.

2. Description of the Related Art

In manufacturing integrated circuits using a photolithography process, light is transmitted through non-opaque portions of a pattern on a reticle, or photomask, through a projection exposure apparatus, and onto a wafer of specially-coated silicon or other semiconductor material. The uncovered portions of the coating, that are exposed to light, are cured. The uncured portions of the coating are removed by an acid bath. Then, the layer of uncovered silicon is altered to produce one layer of the multi-layered integrated circuit. Conventional systems use visible and ultraviolet light for this process. Recently, however, visible and ultraviolet light have been replaced with electron, x-ray, and laser beams, which permit smaller and more intricate patterns.

As the miniaturization of a circuit pattern progresses, the focus depth of the projection exposure apparatus becomes very small, making it difficult to align accurately the overlay of circuit patterns of the multi-layered integrated circuit. As a result, a primary consideration for an overall design of the photolithography system includes building components of the system that achieve precision by maintaining small tolerances. Any vibration, distortion, or misalignment caused by internal, external or environmental disturbances must be kept at minimum. When these disturbances affect an individual part, the focusing properties of the photolithography system are collectively altered.

Occasionally, a portion of the photolithography system, i.e., a carrier of a sub-assembly, needs to be removed from the main assembly for servicing purposes, periodic maintenance, or other reasons. In one example, the sub-assembly may be a wafer stage carried by a wafer stage carrier that needs to be removed from the exposure apparatus as the main assembly. In an extremely sensitive and delicate system, such as the photolithography system where any types of disturbances, such as vibration, heat, and the like, may alter the accurate alignment of the system, there is a need for a wafer stage carrier and method to remove the wafer stage carrier from the exposure apparatus without causing any disturbances, or with minimized disturbances, to other parts and components of the photolithography system.

SUMMARY OF THE INVENTION

The advantages and purposes of the invention will be set forth in part in the description which follows, and in part will be obvious from the description, or may be learned by practice of the invention. The advantages and purposes of the invention will be realized and attained by the elements and combinations particularly pointed out in the appended claims.

To attain the advantages and consistent with the principles of the invention, as embodied and broadly described herein, a first aspect of the invention is a carrier for sensitive devices to facilitate removing the sensitive devices constructed in a sub-assembly from a main assembly. The sub-assembly is removably attached to the main assembly. The carrier comprises a set of expandable supports, when in an expanded state, supporting the sub-assembly on a stationary surface, and a set of removal supports to support and remove the sub-assembly away from the main assembly after detaching the sub-assembly from the main assembly.

A second aspect of the present invention is a method for removing a carrier for sensitive devices constructed in a sub-assembly from a main assembly. The method comprises expanding a set of expandable supports until the sub-assembly is supported thereby on a stationary surface, and detaching the sub-assembly from the main assembly. The method also comprises reducing expansion of the set of expandable supports to remove the sub-assembly from the main assembly.

A third aspect of the present invention is a wafer stage carrier for carrying a wafer stage assembly. The wafer stage carrier is removably connected to an apparatus frame of an exposure apparatus. The wafer stage carrier comprises a wafer stage base plate having a plurality of body supports for attaching the wafer stage carrier to the apparatus frame, and a set of expandable supports, which when in an expanded state, supports the wafer stage carrier on a stationary surface. The wafer stage carrier also comprises a set of removal supports to support and remove the wafer stage carrier away from the exposure apparatus after detaching the wafer stage carrier from the apparatus frame of the exposure apparatus.

A fourth aspect of the present invention is a method for removing a wafer stage carrier from an exposure apparatus. The wafer stage carrier is removably connected to an apparatus frame of the exposure apparatus. The method comprises expanding a set of expandable supports until the wafer stage carrier is supported thereby on a stationary surface, and detaching the wafer stage carrier from the apparatus frame. The method also comprises reducing expansion of the set of expandable supports to remove the wafer stage carrier from the exposure apparatus.

A fifth aspect of the present invention is a method for attaching a carrier for devices constructed in a sub-assembly to a main assembly. The method comprises expanding at least one expandable support until the sub-assembly is supported thereby on a stationary surface, attaching the sub-assembly to the main assembly, and reducing expansion of the at least one expandable support to support the sub-assembly by the main assembly.

A sixth aspect of the present invention is a method for making an exposure apparatus comprising steps of providing a main assembly including an exposure device, and removably attaching a sub-assembly to a part of the main assembly with a removal device. The removal device comprises at least one expandable support, when in an expanded state, supporting the sub-assembly on a stationary surface, and at least one removal support to support and remove the sub-assembly away from the main assembly after detaching the sub-assembly from the main assembly.

It is to be understood that both the foregoing general description and the following detailed description are exemplary and explanatory only and are not restrictive of the invention as claimed. Additional advantages will be set forth in the description which follows, and in part will be understood from the description, or may be learned by practice of the invention. The advantages and purposes may be obtained by means of the combinations set forth in the attached claims.

BRIEF DESCRIPTION OF THE DRAWINGS

The accompanying drawings, which are incorporated in and constitute a part of this specification, illustrate several embodiments of the invention and, together with the description, serve to explain the principles of the invention. In the drawings.

DESCRIPTION OF THE INVENTION

Reference will now be made in detail to an embodiment of the device, assembly and method consistent with the principles of the present invention, examples of which are illustrated in the accompanying drawings. The invention will be further clarified by the following examples, which are intended to be exemplary of the invention.

The device, assembly and method consistent with the principles of the present invention are useful to allow removal of a carrier for sensitive devices constructed in a sub-assembly from a main assembly. One application of this invention is in a photolithography system to manufacture semiconductor substrates, whereby a wafer stage carrier of a wafer stage 66 (shown in FIG. 4) constitutes the sub-assembly, and an exposure apparatus 21 constitutes the main assembly. The principles of this invention are similarly applicable to other parts of the photolithography system, or other sensitive system having high-accuracy in alignment. Thus, this invention is not limited to any particular application. Rather, the device, assembly and method disclosed herein could be used in any system configured to embody a sub-assembly removably attached to a main assembly.

One consideration in designing the wafer stage carrier and method of the present invention is self-sufficiency of the device which allows easy removal, moving, and installation of the wafer stage carrier without requiring a forklift or other similar tools. Another consideration is to minimize the empty space required underneath the wafer stage carrier to maximize the stiffness of the baseplate of the wafer stage carrier.

Figure 1:
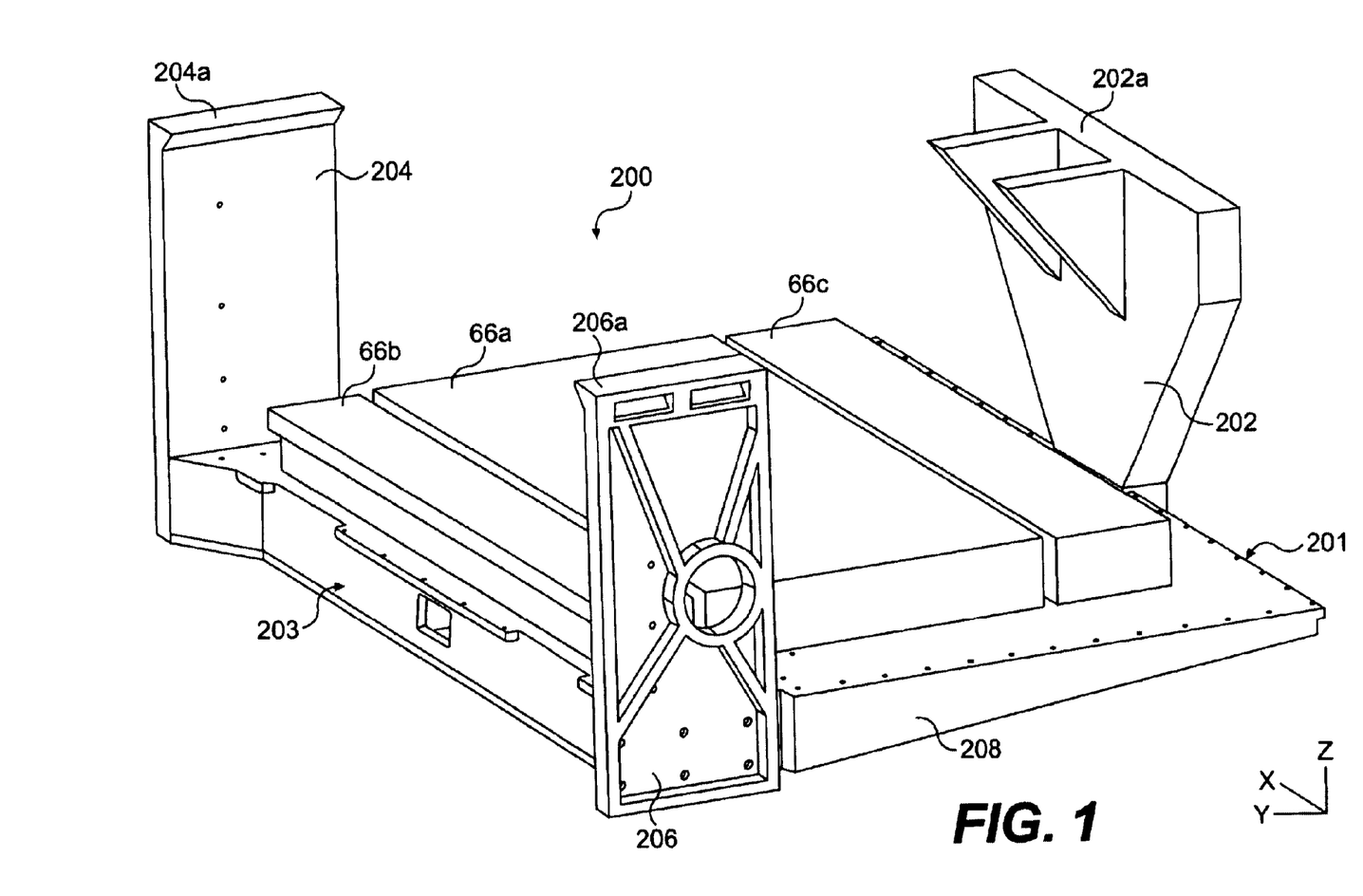
FIG. 1 is a top perspective view from a front side of a wafer stage carrier consistent with the principles of the present invention.

As illustrated in FIG. 1, the wafer stage carrier 200 may carry components of wafer stage 66, including wafer stage base 66a and mover assembly bases 66b and 66c. The components of wafer stage 66 are supported on a base plate 208 by a plurality of body supports 202, 204, and 206. Body support 202 is provided on a rear side 201 of wafer stage carrier 200, while body supports 204 and 206 are on a front side 203 thereof. Each of body supports 202, 204, and 206 has a top mounting surface 202a, 204a, and 206a, respectively, for connecting wafer stage carrier 200 to exposure apparatus 21, such as the apparatus frame 72 of exposure apparatus 21 shown in FIG. 4. Body support 202 may also have a bottom mounting surface 202b (shown in FIG. 2) for connecting body support 202 to wafer stage carrier 200. Mechanical fasteners, for example, bolts, screws, clamps, or equivalents, may be used to fasten wafer stage carrier 200 to apparatus frame 72.

Figure 2:
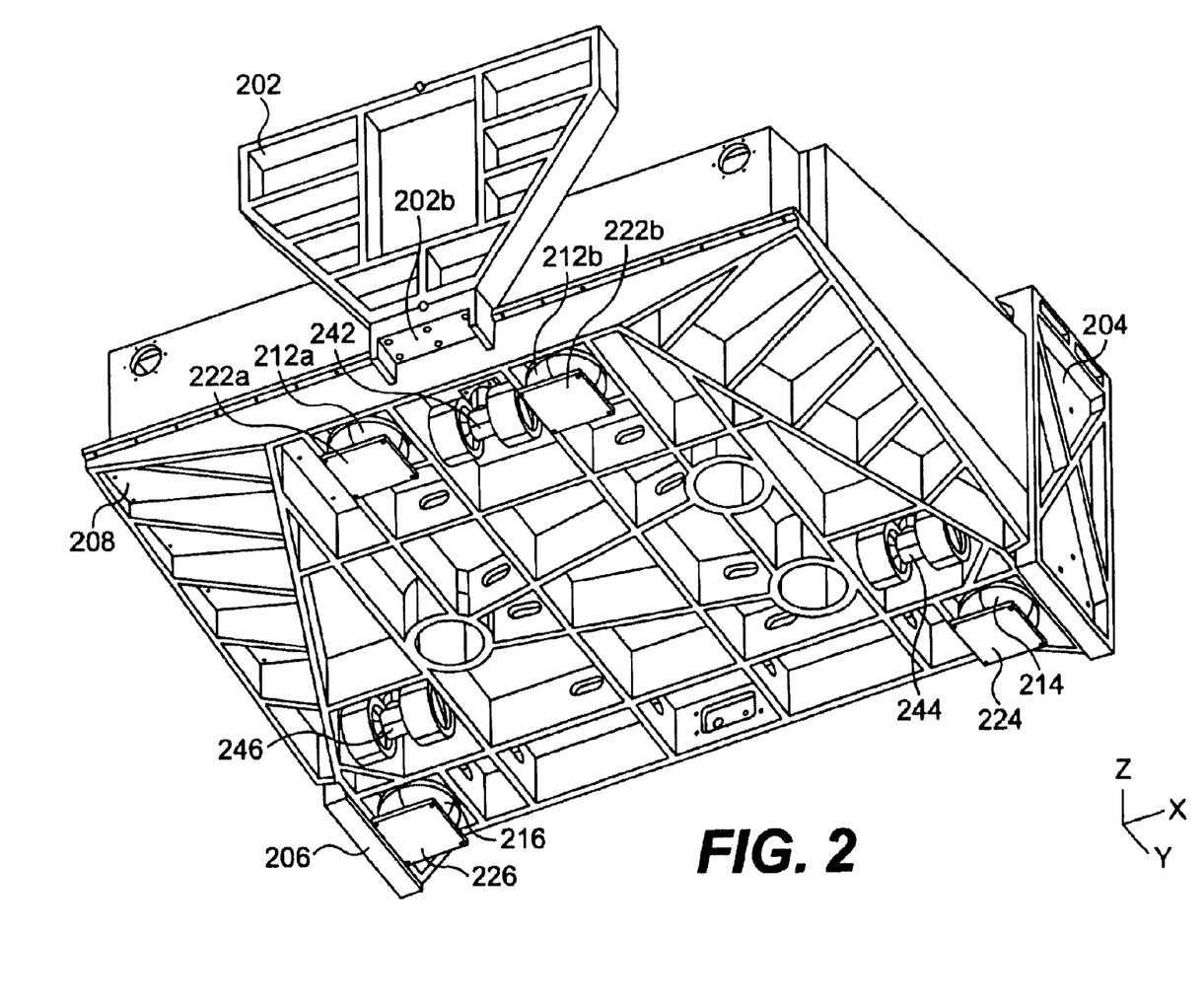
FIG. 2 is a bottom perspective view from a rear side of the wafer stage carrier shown in FIG. 1.

As illustrated in FIG. 2, the underside of base plate 208 may have a ribbed design to provide additional structural strength to wafer stage carrier 200. Consistent with the principles of the present invention, a wafer stage removal assembly is provided on the underside of base plate 208. The removal assembly includes a set of expandable support and a set of removal support. The set of expandable support may be a set of pneumatic support, such as, a plurality of air springs 212a, 212b, 214, and 216. In the embodiment shown, air springs 212a and 212b are smaller in size compared with air springs 214 and 216 to illustrate that a pair of air springs may serve the same function as one with a higher capacity.

Each of air springs 212a, 212b, 214, and 216 is basically an expandable rubber balloon and generally commercially available through a tire manufacturing company, such as Goodyear, Firestone, etc. Each of air springs 212a, 212b, 214, and 216 usually comes with a pair of metal plates sandwiching the air spring. In this embodiment, one part of the metal plates (not shown) is for attachment to the underside of wafer stage carrier 200, and the other part 222a, 222b, 224, or 226 is for supporting each air spring 212a, 212b, 214, or 216, respectively, on another stationary surface, such as the ground.

Also consistent with the principles of the present invention, the set of removable support includes a plurality of rollers to slidably remove wafer stage carrier 200 from exposure apparatus 21. In one embodiment, there are three rollers 242, 244, and 246. Rollers 242, 244, and 246 may be casters, manually steered wheels, ball casters, or fixed wheels. Alternatively, the rollers may also be air bearings provided on the underside of base plate 208 to allow wafer stage carrier 200 to levitate above the stationary surface as being removed from the main assembly.

Figure 4:
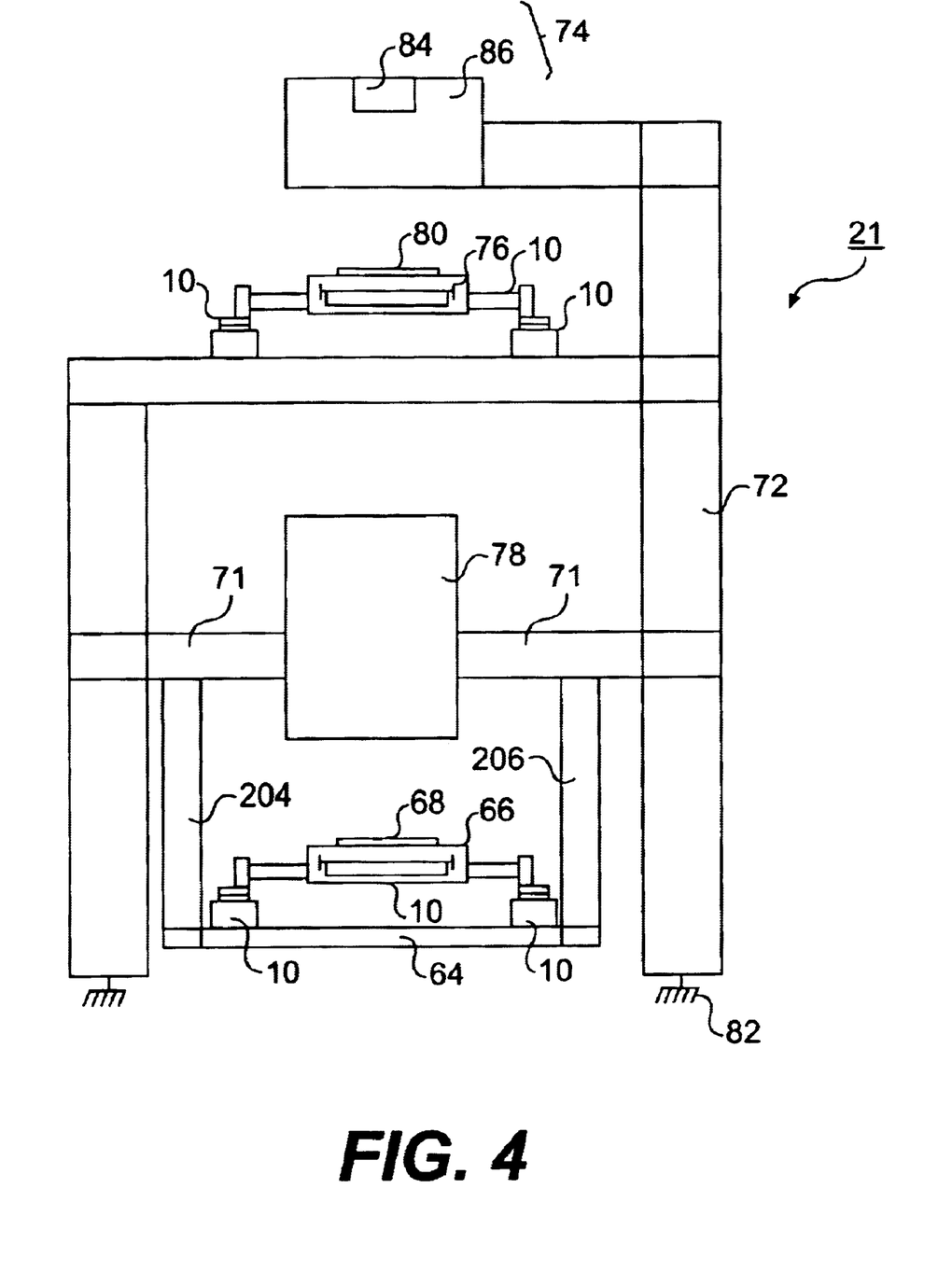
FIG. 4 is a schematic view of an exposure apparatus.

In the embodiment shown in FIG. 2, the set of expandable support and the set of removal support are positioned adjacent to body supports 202, 204, and 206, i.e., around the sections where wafer stage carrier 200 is attached to segments 71 of apparatus frame 72 (shown in FIG. 4). According to this embodiment, when the weight of wafer stage carrier 200 is transferred from body supports 202, 204, and 206 to expandable support, i.e., air springs 212a, 212b, 214, and 216, respectively, and to removal support, i.e., rollers 242, 244, and 246, base plate 208 as well as other components of wafer stage carrier 200 experience minimum deformation and distortion. This invention anticipates that the expandable support and removal support may have different positional configurations to meet other design specifications.

In alternative embodiments, the set of expandable support may be a set of retractable mechanical support, or a set of chargeable electromagnetic support, or any combination of the above and equivalents thereof. For example, the set of retractable mechanical support may be a plurality of robotic legs (not shown) which may be extended from or retracted to base plate 208 as necessary. Similarly, the set of chargeable electromagnetic support may be a plurality of actuators (not shown), each generating variable electromagnetic field to support wafer stage carrier 200 and lower it until reaching the stationary surface.

Further consistent with the principles of the present invention, wafer stage carrier 200 may also be provided with a set of roller guides 280 (shown in FIG. 3D) to facilitate removal of wafer stage carrier 200 from the main body. In exposure apparatus 21, such as the one shown in FIG. 4, there is commonly a tight clearance of approximately 5–10 mm between an outer periphery of wafer stage 66 and apparatus frame 72. To protect sensitive components of wafer stage carrier 200 and exposure apparatus 21, roller guides 280 are provided to cushion the outer periphery of wafer stage carrier 200 from accidental bumping with the inner periphery of the main assembly. Roller guides 280 may include, for example, a cam follower 282 attached to the inner periphery of segments 71 of apparatus frame 72, and a corresponding rail 284 attached to the outer periphery of wafer stage carrier 200. Vice versa, cam follower 282 may be attached to the outer periphery of wafer stage carrier 200, while rail 284 attached to the inner periphery of segments 71.

The removal assembly consistent with the principles of the present invention operates as follows and as schematically illustrated in FIGS. 3A–3D. For exemplary purposes, only one expandable support, i.e., one air spring 212a, 212b, 214, or 216, and one roller 242, 244, or 246 are shown.

Figure 3A:
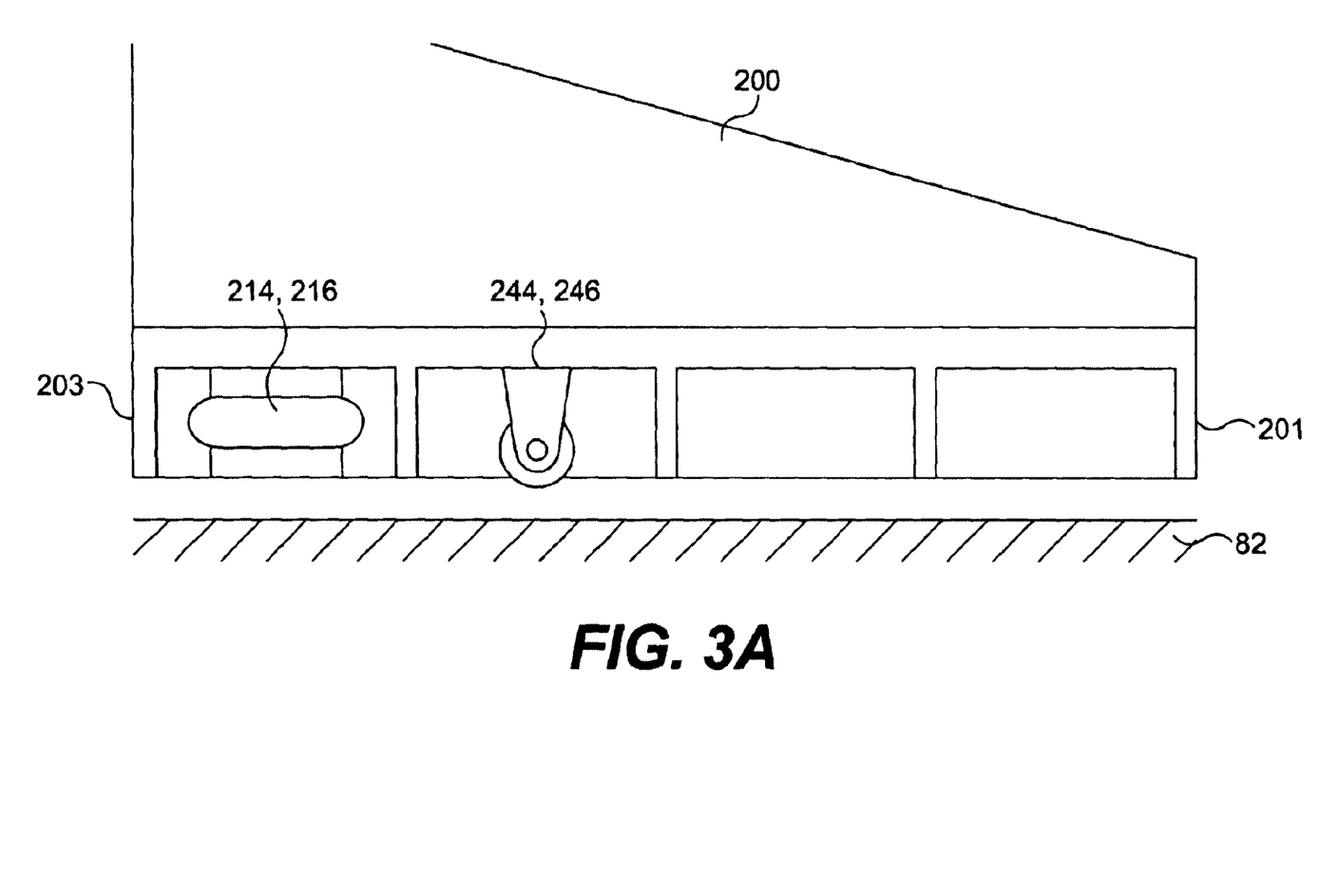
FIGS. 3A–3C are schematic elevation views illustrating the wafer stage carrier and method consistent with the principles of the present invention.

In FIG. 3A, wafer stage carrier 200 is attached to segments 71 of apparatus frame 72 via body supports 202, 204, and 206. Wafer stage carrier 200, as well as all components of the removal assembly (only one expandable support, i.e., one air spring 212a, 212b, 214, or 216, and one roller 242, 244, or 246 are shown) hang above stationary surface 82.

Figure 3B:
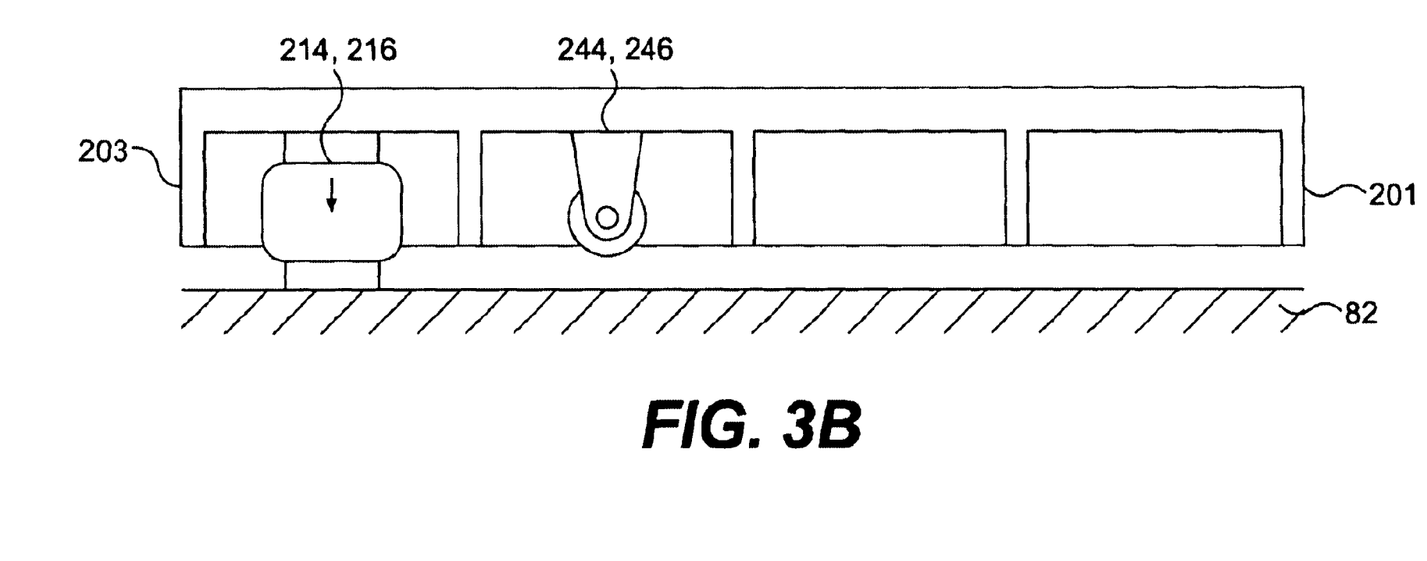

In FIG. 3B, when initiating the removal process, air springs 212a, 212b, 214, and 216 are inflated by feeding in air or other fluid from one or more sources (not shown) so that air springs 212a, 212b, 214, and 216 extend downwards until metal plates 222a, 222b, 224, and 226, respectively, reach stationary surface 82. In one preferred embodiment, air springs 212a, 212b, 214, and 216 are inflated until the overall internal pressure exerts a support force equivalent to the weight of wafer stage carrier 200.

At this juncture, wafer stage carrier 200 may be detached from apparatus frame 72 by loosening and removing the fasteners connecting body supports 202, 204, and 206 to segments 71. Body support 202 on the rear side 201 may remain attached to the main body by removing the fasteners on bottom mounting surface 202b so that wafer stage carrier 200 is clear from other components of exposure apparatus 21, such as lens assembly 78 of exposure apparatus 21 as shown in FIG. 4. At this equilibrium, wafer stage carrier 200 is kinematically supported by air springs 212a, 212b, 214, and 216. The term kinematic means that a component or an assembly is supported with exactly the necessary amount of constraint without over constraining. The weight of wafer stage carrier 200 is thus swimmingly shifted from being supported by body supports 202, 204, and 206, to the expandable support, i.e., air springs 212a, 212b, 214, or 216.

Figure 3C:
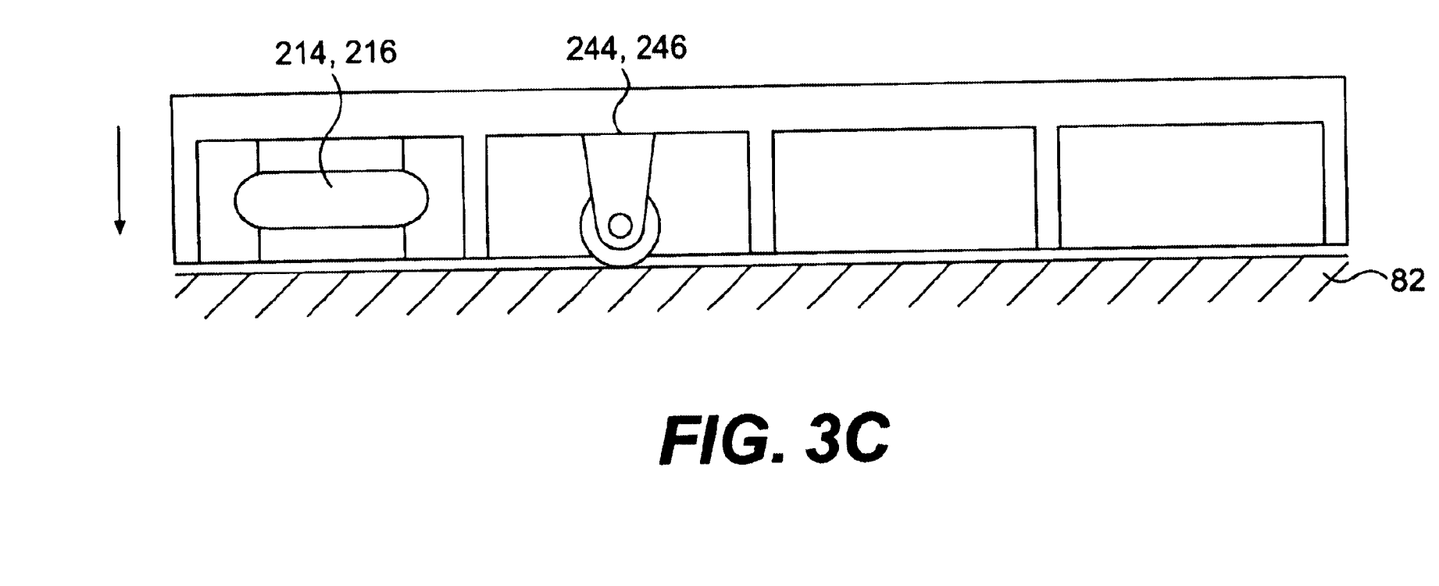

In FIG. 3C, air springs are then deflated to lower detached wafer stage carrier 200 from exposure apparatus 21 until the removal support, i.e., rollers 242, 244, and 246, reach stationary surface 82 and wafer stage carrier 200 rests thereon.

Figure 3D:
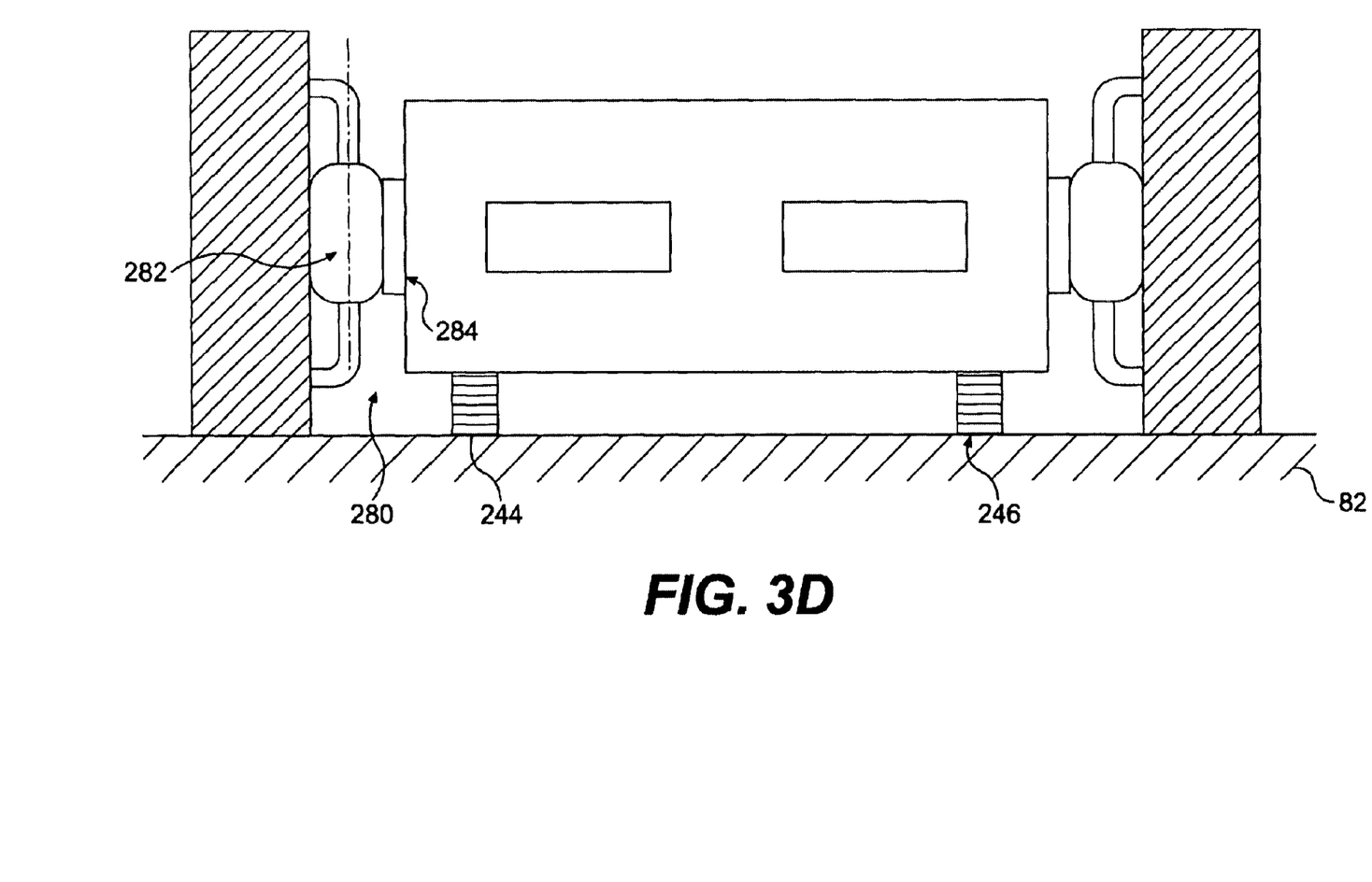
FIG. 3D is a schematic front view illustrating a set of roller guides of the wafer stage carrier shown in FIGS. 3A–3C.

Thereafter, as illustrated in FIG. 3D, wafer stage carrier 200 may be removed from exposure apparatus 21, for example, by pulling or pushing sub-assembly 200 toward front side 203. Alternatively, in the case where exposure apparatus 21 does not have any protruding components, wafer stage carrier 200 may be removed by pulling or pushing wafer stage carrier 200 toward either front side 203 or rear side 201. The set of roller guides 280 protect wafer stage carrier 200 from accidental bumping into exposure apparatus 21 during such removal. During movement of the wafer stage carrier 200, air springs 212a, 212b, 214, and 216 could be inflated to lift the rollers 242, 244, and 246 off the stationary surface to allow steering the wafer stage carrier 200. The wafer stage carrier 200 could be allowed small horizontal motion in the case of fixed the rollers, because the air springs 212a, 212b, 214, and 216 have low horizontal stiffness. For larger motions, the wafer stage carrier 200 can be repeatedly raised on air springs, pushed to side of the wafer stage carrier 200 turn it, and lowered onto the rollers.

As can be seen, to attach wafer stage carrier 200 to the main assembly, i.e. apparatus frame 72 of exposure apparatus 21, a reversed process may be followed as shown in FIG. 3C by positioning wafer stage carrier 200 under segment 71 of apparatus frame 72 so that body supports 204 and 206 are approximately aligned with the fasteners on segment 71. Then, as shown in FIG. 3B, air springs 212a, 212b, 214, and 216 may be inflated to raise wafer stage carrier 200 until reaching the equilibrium such that top mounting surface 204a and 206a are aligned with the fasteners on segment 71, and bottom mounting surface 202b is aligned with the corresponding fasteners on rear side 201 of base plate 208. Thereafter, at this juncture, wafer stage carrier 200 is attached to exposure apparatus 21 by fastening the fasteners on body supports 202, 204, and 206. Once wafer stage carrier 200 is securely fastened to exposure apparatus 21, air springs 212a, 212b, 214, and 216 may be deflated again, as shown in FIG. 3A.

FIG. 4 illustrates a wafer stage 66 as a part of exposure apparatus 21 of a photolithography system to manufacture semiconductor wafers 68. All of the elements of wafer stage carrier 200 are not shown. Wafer stage 66 positions the semiconductor wafer 68 as wafer stage 66 is being accelerated by a stage force (not shown) generated in response to a wafer manufacturing control system (not shown). The wafer manufacturing control system is the central computerized control system executing the wafer manufacturing process. To permit smaller and more intricate circuit pattern, projection lens assembly 78 must accurately focus the energy beam to align the overlay of circuit patterns of the multi-layered integrated circuit.

An apparatus frame 72 supports projection lens assembly 78. In operation, exposure apparatus 21 transfers a pattern of an integrated circuit from reticle 80 onto semiconductor wafer 68. Exposure apparatus 21 can be mounted to a base 82 (stationary surface), i.e., the ground or via a vibration isolation system (not shown). Apparatus frame 72 is rigid and supports the components of exposure apparatus 21, including reticle stage 76, wafer stage 66, lens assembly 78, and illumination system 74.

Illumination system 74 includes an illumination source 84 to emit a beam of light energy. Illumination system 74 also includes an illumination optical assembly 86 to guide the beam of light energy from illumination source 84 to lens assembly 78. The beam selectively illuminates different portions of reticle 80 and exposes wafer 68.

Lens assembly 78 projects and/or focuses the light passing through reticle 80 to wafer 68. Lens assembly 78 may magnify or reduce the image illuminated on reticle 80. Lens assembly 78 may also be a 1×magnification system.

Reticle stage 76 holds and positions reticle 80 relative to lens assembly 78 and wafer 68. Similarly, wafer stage 66 holds and positions wafer 68 with respect to the projected image of the illuminated portions of reticle 80. Wafer stage 66 and reticle stage 76 are moved by a plurality of motors 10.

There are several different types of photolithography systems, including a scanning type and a step-and-repeat type. In the scanning type photolithography system, illumination system 74 exposes the pattern from reticle 80 onto wafer 68 with reticle 80 and wafer 68 moving synchronously. Reticle stage 76 moves reticle 80 on a plane which is generally perpendicular to an optical axis of lens assembly 78, while wafer stage 66 moves wafer 68 on another plane generally perpendicular to the optical axis of lens assembly 78. Scanning of reticle 80 and wafer 68 occurs while reticle 80 and wafer 68 are moving synchronously.

Alternately, in the step-and-repeat type photolithography system, illumination system 74 exposes reticle 80 while reticle 80 and wafer 68 are stationary. Wafer 68 is in a constant position relative to reticle 80 and lens assembly 78 during the exposure of an individual field. Subsequently, between consecutive exposure steps, wafer 68 is consecutively moved by wafer stage 66 perpendicular to the optical axis of lens assembly 78 so that the next field of semiconductor wafer 68 is brought into position relative to lens assembly 78 and reticle 80 for exposure. Following this process, the images on reticle 80 are sequentially exposed onto the fields of wafer 68.

The use of exposure apparatus 21 provided herein is not limited to a photolithography system for a semiconductor manufacturing. Exposure apparatus 21, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern by closely locating a mask and a substrate without the use of a lens assembly. Additionally, the present invention provided herein can be used in other devices, including other semiconductor processing equipment, machine tools, metal cutting machines, and inspection machines.

The illumination source 84 can be g-line (436 nm), i-line (365 nm), KrF excimer laser (248 nm), ArF excimer laser (193 nm) and $F_2$ laser (157 nm). Alternatively, illumination source 84 can also use charged particle beams such as x-ray and electron beam. For instance, in the case where an electron beam is used, thermionic emission type lanthanum hexaboride ($LaB_6$) or tantalum (Ta) can be used as an electron gun. Furthermore, in the case where an electron beam is used, the structure could be such Leither a mask is used or a pattern can be directly formed on a substrate without the use of a mask.

With respect to lens assembly 78, when far ultra-violet rays such as the excimer laser is used, glass materials such as quartz and fluorite that transmit far ultra-violet rays is preferably used. When the $F_2$ type laser or x-ray is used, lens assembly 78 should preferably be either catadioptric or refractive (a reticle should also preferably be a reflective type), and when an electron beam is used, electron optics should preferably comprise electron lenses and deflectors. The optical path for the electron beams should be in a vacuum.

Also, with an exposure device that employs vacuum ultra-violet radiation (VUV) of wavelength 200 nm or lower, use of the catadioptric type optical system can be considered. Examples of the catadioptric type of optical system include the disclosure Japan Patent Application Disclosure No. 8-171054 published in the Official Gazette for Laid-Open Patent Applications and its counterpart U.S. Pat. No. 5,668,672, as well as Japan Patent Application Disclosure No.10-20195 and its counterpart U.S. Pat. No. 5,835,275. In these cases, the reflecting optical device can be a catadioptric optical system incorporating a beam splitter and concave mirror. Japan Patent Application Disclosure No. 8-334695 published in the Official Gazette for Laid-Open Patent Applications and its counterpart U.S. Pat. No. 5,689,377 as wall as Japan Patent Application Disclosure No.10-3039 and its counterpart U.S. patent application Ser. No. 873,606 (Application Date: Jul.12, 1997) also use a reflecting-refracting type of optical system incorporating a concave mirror, etc., but without a beam splitter, and can also be employed with this invention. The disclosures in the above-mentioned U.S. patents, as well as the Japan patent applications published in the Official Gazette for Laid-Open Patent Applications are incorporated herein by reference.

Further, in photolithography systems, when linear motors (see U.S. Pat. Nos. 5,623,853 or 5,528,118) are used in a wafer stage or a reticle stage, the linear motors can be either an air levitation type employing air bearings or a magnetic levitation type using Lorentz force or reactance force. Additionally, the stage could move along a guide, or it could be a guideless type stage which uses no guide. The disclosures in U.S. Pat. Nos. 5,623,853 and 5,528,118 are incorporated herein by reference.

Alternatively, one of the stages could be driven by a planar motor, which drives the stage by electromagnetic force generated by a magnet unit having two-dimensionally arranged magnets and an armature coil unit having two-dimensionally arranged coils in facing positions. With this type of driving system, either one of the magnet unit or the armature coil unit is connected to the stage and the other unit is mounted on the moving plane side of the stage.

Movement of the stages as described above generates reaction forces which can affect performance of the photolithography system. Reaction forces generated by the wafer (substrate) stage motion can be released mechanically to the floor (ground) by use of a frame member as described in U.S. Pat. No. 5,528,118 and published Japanese Patent Application Disclosure No. 8-166475. Additionally, reaction forces generated by the reticle (mask) stage motion can be mechanically released to the floor (ground) by use of a frame member as described in U.S. Pat. No. 5,874,820 and published Japanese Patent Application Disclosure No. 8-330224. The disclosures in U.S. Pat. Nos. 5,528,118 and 5,874,820 and Japanese Patent Application Disclosure No. 8-330224 are incorporated herein by reference.

As described above, a photolithography system according to the above described embodiments can be built by assembling various subsystems, including each element listed in the appended claims, in such a manner that prescribed mechanical accuracy, electrical accuracy and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, total adjustment is performed to make sure that every accuracy is maintained in the complete photolithography system. Additionally, it is desirable to manufacture an exposure system in a clean room where the temperature and purity are controlled.

Figure 5:
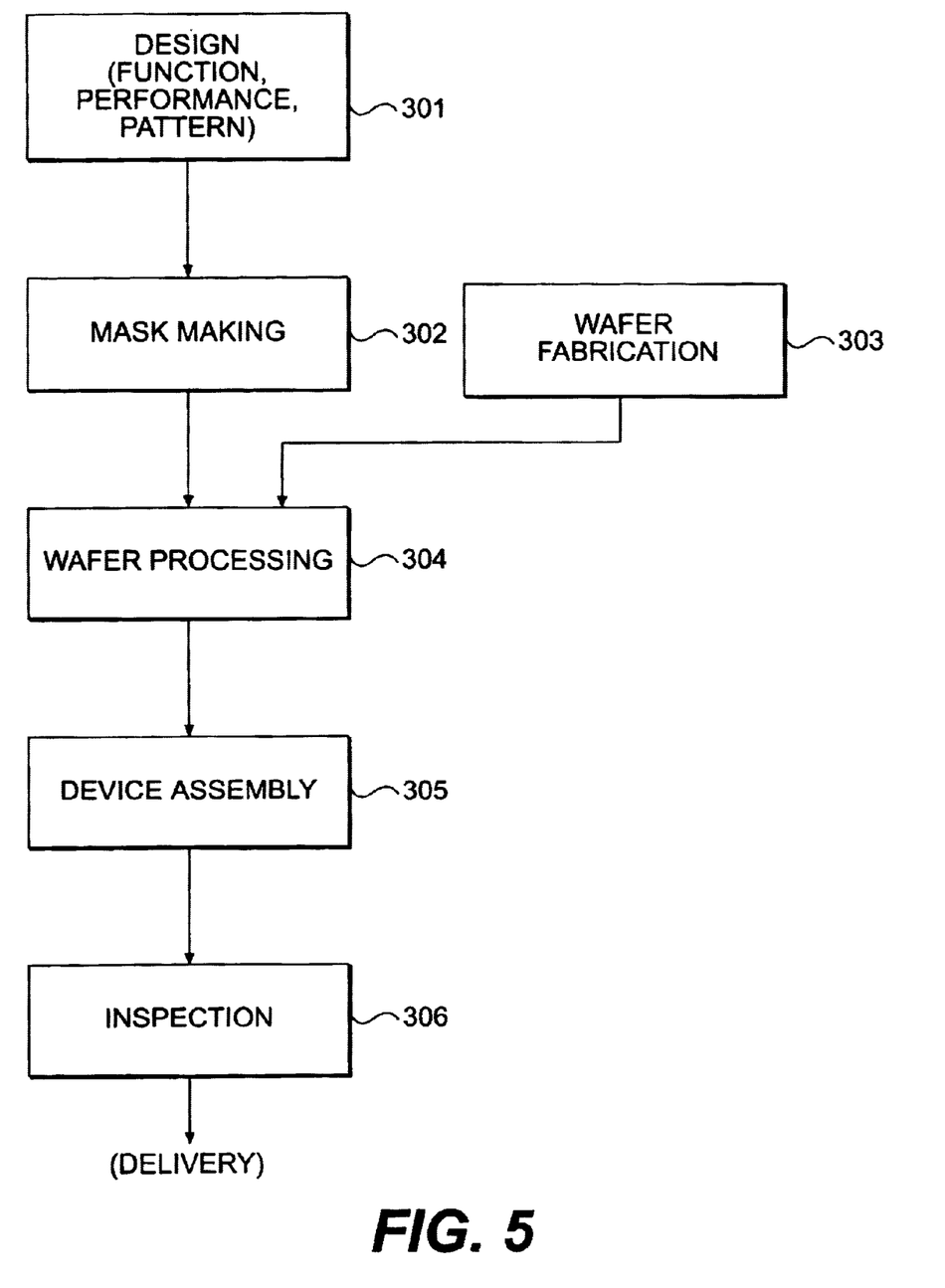
FIG. 5 is a flow chart outlining a process for manufacturing semiconductor wafers.

Further, semiconductor devices can be fabricated using the above described systems, by the process shown generally in FIG. 5. In step 301 the device's function and performance characteristics are designed. Next, in step 302, a mask (reticle) having a pattern is designed according to the previous designing step, and in a parallel step 303, a wafer is made from a silicon material. The mask pattern designed in step 302 is exposed onto the wafer from step 303 in step 304 by a photolithography system described hereinabove consistent with the principles of the present invention. In step 305 the semiconductor device is assembled (including the dicing process, bonding process and packaging process), then finally the device is inspected in step 306.

Figure 6:
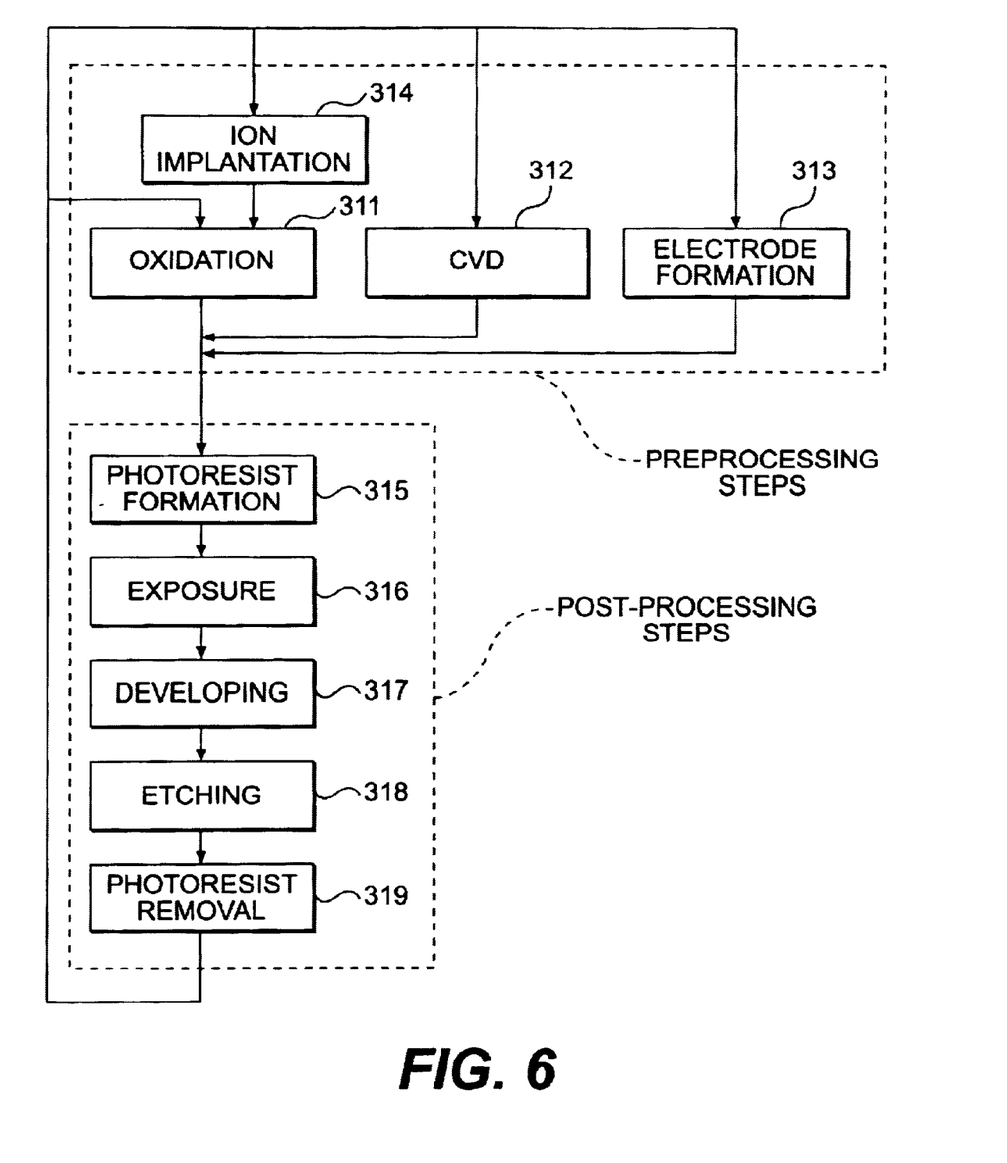
FIG. 6 is a flow chart outlining the semiconductor manufacturing process in further detail.

FIG. 6 illustrates a detailed flowchart example of the above-mentioned step 304 in the case of fabricating semiconductor devices. In step 311 (oxidation step), the wafer surface is oxidized. In step 312 (CVD step), an insulation film is formed on the wafer surface. In step 313 (electrode formation step), electrodes are formed on the wafer by vapor deposition. In step 314 (ion implantation step), ions are implanted In the wafer. The above mentioned steps 311–314 form the preprocessing steps for wafers during wafer processing, and selection is made at each step according to processing requirements.

At each stage of wafer processing, when the above-mentioned preprocessing steps have been completed, the following post-processing steps are implemented. During post-processing, initially, in step 315 (photoresist formation step), photoresist is applied to a wafer. Next, in step 316, (exposure step), the above-mentioned exposure device is used to transfer the circuit pattern of a mask (reticle) to a wafer. Then, in step 317 (developing step), the exposed wafer is developed, and in step 318 (etching step), parts other than residual photoresist (exposed material surface) are removed by etching. In step 319 (photoresist removal step), unnecessary photoresist remaining after etching is removed.

Multiple circuit patterns are formed by repetition of these preprocessing and post-processing steps.

It will be apparent to those skilled in the art that various modifications and variations can be made in the sub-assembly, the expandable support, the removal support, and the methods described, the material chosen for the present invention, and in construction of the sub-assembly, the main assembly, the photolithography systems as well as other aspects of the invention without departing from the scope or spirit of the invention Other embodiments of the invention will be apparent to those skilled in the art from consideration of the specification and practice of the invention disclosed herein. It is intended that the specification and examples be considered as exemplary only, with a true scope and spirit of the invention being indicated by the following claims and their equivalents.

We claim:

1. A removal device to facilitate removing devices constructed in a sub-assembly from a main assembly, the sub-assembly being removably attached to the main assembly, comprising:
   at least one expandable support attached to the sub-assembly, the at least one expandable support, when in an expanded state, supporting the sub-assembly on a stationary surface; and
   at least one removal support to support and remove the sub-assembly away from the main assembly after detaching the sub-assembly from the main assembly.

2. The removal device of claim 1, wherein the at least one expandable support is at least one expandable pneumatic support.

3. The removal device of claim 2, wherein the at least one expandable pneumatic support comprises at least one air spring.

4. The removal device of claim 3, further comprising:
   a vacuum source to provide vacuum to lift the at least one air spring away from the stationary surface.

5. The removal device of claim 1, wherein the at least one expandable support is at least one retractable mechanical support.

6. The removal device of claim 5, wherein the at least one retractable mechanical support comprises at least one retractable leg.

7. The removal device of claim 1, wherein the at least one expandable support is at least one chargeable electromagnetic support.

8. The removal device of claim 7, wherein the at least one chargeable electromagnetic support comprises at least one actuator.

9. The removal device of claim 1, wherein the at least one removal support is one of a plurality of wheels, a plurality of casters, at least one pneumatic bearing, and a combination thereof.

10. The removal device of claim 1, further comprising:
    at least one roller guide to facilitate removing the sub-assembly away from the main assembly.

11. The removal device of claim 10, wherein the at least one roller guide comprises:
    a first portion of the at least one roller guide provided on an outer periphery of the sub-assembly; and
    a second portion of the at least one roller guide, corresponding to the first portion, provided on an inner periphery of the main assembly.

12. The removal device of claim 11, wherein the first portion of the at least one roller guide comprises at least one rail, and the second portion of the at least one roller guide comprises at least one cam follower.

13. The removal device of claim 1, wherein the at least one expandable support and the at least one removal support are provided on an underside of a base plate of the sub-assembly.

14. The removal device of claim 13, wherein the at least one expandable support and the at least one removal support are positioned adjacent to sections on the underside of the base plate where the sub-assembly attaches to the main assembly.

15. A projection lens assembly comprising the removal device of claim 1.

16. A photolithography system comprising the removal device of claim 1.

17. A method for removing a carrier for devices constructed in a sub-assembly from a main assembly, comprising:
    providing at least one expandable support attached to the sub-assembly;
    expanding the at least one expandable support until the sub-assembly is supported thereby on a stationary surface;
    detaching the sub-assembly from the main assembly; and reducing expansion of the at least one expandable support to remove the sub-assembly from the main assembly.

18. The method of claim 17, wherein the at least one expandable support is at least one pneumatic support, and the expanding comprises inflating the at least one pneumatic support.

19. The method of claim 18, wherein the at least one pneumatic support is at least one air spring.

20. The method of claim 19, further comprising:
creating a vacuum in the at least one air spring to lift the at least one pneumatic support clearing off the stationary surface.

21. The method of claim 17, wherein the at least one expandable support is at least one retractable mechanical support, and the expanding comprises extending at least one retractable leg.

22. The method of claim 17, wherein the at least one expandable support is at least one chargeable electromagnetic support, and the expanding comprises charging at least one electromagnetic actuator to support the sub-assembly.

23. The method of claim 17, wherein the at least one expandable support is expanded until the sub-assembly is kinematically supported thereby.

24. The method of claim 17, wherein each of the at least one expandable support is positioned adjacent to a section on the underside of the sub-assembly where the sub-assembly attaches to the main assembly.

25. The method of claim 17, further comprising providing at least one track guide around a periphery of the sub-assembly to facilitate removal of the sub-assembly from the main assembly.

26. A method for disassembling a projection lens assembly by performing the removal method of claim 17.

27. A method for disassembling a photolithography system by performing the removal method of claim 17.

28. A wafer stage carrier for carrying a wafer stage assembly, the wafer stage carrier being removably connected to an apparatus frame of an exposure apparatus, the wafer stage carrier comprising:
a wafer stage base plate having a plurality of body supports for attaching the wafer stage carrier to the apparatus frame;
at least one expandable support, when in an expanded state, supporting the wafer stage carrier on a stationary surface; and
at least one removal support to support and remove the wafer stage carrier away from the exposure apparatus after detaching the wafer stage carrier from the apparatus frame of the exposure apparatus.

29. The wafer stage carrier of claim 28, wherein the at least one expandable supports is at least one expandable pneumatic support.

30. The wafer stage carrier of claim 29, wherein the at least one expandable pneumatic support comprises at least one air spring.

31. The wafer stage carrier of claim 30, further comprising:
a vacuum source to provide vacuum to and lift the at least one air spring away from the stationary surface.

32. The wafer stage carrier of claim 29, wherein the at least one expandable support is at least one retractable mechanical support.

33. The wafer stage carrier of claim 32, wherein the at least one retractable mechanical support comprises at least one retractable leg.

34. The wafer stage carrier of claim 29, wherein the at least one expandable support is at least one chargeable electromagnetic support.

35. The wafer stage carrier of claim 34, wherein the at least one chargeable electromagnetic support comprises at least one actuator.

36. The wafer stage carrier of claim 28, wherein the at least one removal support is one of a plurality of wheels, a plurality of casters, at least one pneumatic bearing, and a combination thereof.

37. The wafer stage carrier of claim 28, further comprising:
at least one roller guide to facilitate removing the wafer stage carrier away from the exposure apparatus.

38. The wafer stage carrier of claim 37, wherein the at least one roller guide comprises:
a first portion of the at least one roller guide provided on an outer periphery of the wafer stage carrier; and
a second portion of the at least one roller guide, corresponding to the first portion, provided on an inner periphery of the exposure apparatus.

39. The wafer stage carrier of claim 38, wherein the first portion of the at least one roller guide comprises at least one rail, and the second portion of the at lest one roller guide comprises at least one cam follower.

40. The wafer stage carrier of claim 28, wherein the at least one expandable support and the at least one removal support are provided on an underside of the wafer stage base plate.

41. The wafer stage carrier of claim 40, wherein the at least one expandable support and the at least one removal support are positioned adjacent to the plurality of body supports on the underside of the wafer stage base plate.

42. A projection lens assembly comprising the wafer stage carrier of claim 28.

43. A photolithography system comprising the wafer stage carrier of claim 28.

44. A method for removing a wafer stage carrier from an exposure apparatus, the wafer stage carrier being removably connected to an apparatus frame of the exposure apparatus, the method comprising:
expanding at least one expandable support until the wafer stage carrier is supported thereby on a stationary surface;
detaching the wafer stage carrier from the apparatus frame; and
reducing expansion of the at least one expandable support to remove the wafer stage carrier from the exposure apparatus.

45. The method of claim 44, wherein the at least one expandable support is at least one pneumatic support, and the expanding comprises inflating the at least one pneumatic support.

46. The method of claim 45, wherein the at least one pneumatic support is at least one air spring.

47. The method of claim 46, further comprising:
creating a vacuum in the at least one air spring to lift the at least one pneumatic support clearing off the stationary surface.

48. The method of claim 44, wherein the at least one expandable support is expanded until the wafer stage carrier is kinematically supported thereby.

49. The method of claim 44, wherein the at least one expandable support is positioned adjacent to a section of the underside of the wafer stage carrier where the wafer stage carrier attaches to the apparatus frame.

50. The method of claim 44, further comprising providing at least one track guide around a periphery of the wafer stage carrier to facilitate removal of the wafer stage carrier from the exposure apparatus.

51. A method for disassembling a projection lens assembly by performing the method of claim 44.

52. A method for disassembling a photolithography system by performing the method of claim 44.

53. A method for attaching a carrier for devices constructed in a sub-assembly to a main assembly, comprising:

providing at least one expandable support attached to the sub-assembly;

expanding the at least one expandable support until the sub-assembly is supported thereby on a stationary surface;

attaching the sub-assembly to the main assembly; and reducing expansion of the at least one expandable support to support the sub-assembly by the main assembly.

54. A method for making an exposure apparatus by performing the method of claim 53.

55. A method for making an exposure apparatus, the method comprising steps of:

providing a main assembly including an exposure device; and removably attaching a sub-assembly to a part of the main assembly with a removal device, the removal device comprising:

at least one expandable support attached to the sub-assembly, the at least one expandable support, when in an expanded state, supporting the sub-assembly on a stationary surface; and at least one removal support to support and remove the sub-assembly away from the main assembly after detaching the sub-assembly from the main assembly.

56. A removal device to facilitate removing devices constructed in a sub-assembly from a main assembly, the sub-assembly being removably attached to the main assembly, comprising:

at least one expandable support, when in an expanded state, supporting the sub-assembly on a stationary surface;

at least one removal support to support and remove the sub-assembly away from the main assembly after detaching the sub-assembly from the main assembly; and at least one roller guide to facilitate removing the sub-assembly away from the main assembly, the at least one roller guide comprising a first portion of the at least one roller guide provided on an outer periphery of the sub-assembly and a second portion of the at least one roller guide, corresponding to the first portion, provided on an inner periphery of the main assembly, wherein the first portion of the at least one roller guide comprises at least one rail, and the second portion of the at least one roller guide comprises at least one cam follower.

57. A removal device to facilitate removing devices constructed in a sub-assembly from a main assembly, the sub-assembly being removably attached to the main assembly, comprising:

at least one expandable support, when in an expanded state, supporting the sub-assembly on a stationary surface; and at least one removal support to support and remove the sub-assembly away from the main assembly after detaching the sub-assembly from the main assembly, wherein the at least one expandable support and the at least one removal support are provided on an underside of a base plate of the sub-assembly and positioned adjacent to sections on the underside of the base plate where the sub-assembly attaches to the main assembly.

58. A method for removing a carrier for devices constructed in a sub-assembly from a main assembly, comprising:

expanding at least one expandable support until the sub-assembly is supported thereby on a stationary surface;

detaching the sub-assembly from the main assembly;

reducing expansion of the at least one expandable support to remove the sub-assembly from the main assembly; and providing at least one track guide around a periphery of the sub-assembly to facilitate removal of the sub-assembly from the main assembly.

* * * * *

UNITED STATES PATENT AND TRADEMARK OFFICE
CERTIFICATE OF CORRECTION

PATENT NO.   : 6,639,654 B2
DATED        : October 28, 2003
INVENTOR(S)  : Michel Binnard et al.

It is certified that error appears in the above-identified patent and that said Letters Patent is hereby corrected as shown below:

Column 11,
Line 50, "supports" should read -- support --.

Column 12,
Line 21, "lest" should read -- least --.

Signed and Sealed this

Ninth Day of December, 2003

JAMES E. ROGAN
*Director of the United States Patent and Trademark Office*